United States Patent [19]

Hashimoto et al.

[11] Patent Number: 4,460,916
[45] Date of Patent: Jul. 17, 1984

[54] CERAMIC SUBSTRATE WITH INTEGRATED CIRCUIT BONDED THEREON

[75] Inventors: Kaoru Hashimoto, Yamato; Koichi Niwa, Tama; Kyohei Murakawa, Yokohama, all of Japan

[73] Assignee: Fujitsu Limited, Kawasaki, Japan

[21] Appl. No.: 435,548

[22] Filed: Oct. 21, 1982

Related U.S. Application Data

[62] Division of Ser. No. 224,532, filed as PCT JP80/00078, Apr. 18, 1980, publish as WO80/02343, Oct. 30, 1980, § 102(e) Dec. 5, 1980 abandoned.

[30] Foreign Application Priority Data

Apr. 18, 1979 [JP] Japan .................................. 54-46751

[51] Int. Cl.³ ............................................ H01L 27/00
[52] U.S. Cl. ..................................... 357/80; 428/446; 428/699; 428/701; 428/702
[58] Field of Search ............... 428/446, 697, 454, 699, 428/701, 702; 357/80

[56] References Cited

U.S. PATENT DOCUMENTS 2,864,919 12/1958 Stringfellow ........................ 200/144
3,923,530 12/1975 Sherk et al. ............................ 106/53
4,272,500 6/1981 Eggerding et al. .................. 423/327

Primary Examiner—William R. Dixon, Jr.
Assistant Examiner—P. R. Schwartz
Attorney, Agent, or Firm—Staas & Halsey

[57] ABSTRACT

A ceramic substrate, suitable for use as a circuit substrate on which integrated circuit chips are bonded, which consists essentially of, based on the weight of the substrate, 0.5~5.0% by weight of MgO, and 95.0~99.5% by weight of the total of $Al_2O_3$ and $SiO_2$, the proportion of the $Al_2O_3$ to the $SiO_2$ being in the range from 50:50 to 80:20 by weight.

1 Claim, 9 Drawing Figures

CERAMIC SUBSTRATE WITH INTEGRATED CIRCUIT BONDED THEREON

This is a division of application Ser. No. 224,532, filed as PCT JP 80/00078, Apr. 18, 1980, published as WO80/02343, Oct. 30, 1980, §102(e) Dec. 5, 1980, now abandoned which arose from an International Application designating the U.S., Ser. No. PCT/JP80/00078, filed Apr. 18, 1980.

DESCRIPTION

BACKGROUND OF THE INVENTION

The present invention relates to a ceramic substrate for use as a circuit substrate on which chips for integrated circuits, e.g. LSI, are to be bonded, particularly a circuit substrate having a thermal expansion coefficient which is similar to that of silicon, i.e. the chip material of the integrated circuits.

Generally, a ceramic circuit substrate must not exhibit a low bulk density and many pores on the surface and within the body. This is because such pores have a tendency to increase imperfections of the patterns formed directly on the surface of the circuit substrate which patterns interconnect the integrated circuits. Also, such pores may become filled with water, which reduces the reliability of the integrated circuits bonded on the circuit substrate.

Recently, integrated circuits have been bonded directly on circuit substrates with high packaging density in order to improve the propagation speed and the heat dissipation of devices. However, such a direct bonding method involves a difficulty in that, as the chip size increases, the thermal stress generated during the bonding operation increases and fracture the chip. This thermal stress is caused by the difference between the thermal expansion of the chip and the substrate during the bonding operation.

The thermal expansion coefficient of the alumina usually used as a circuit substrate is $7 \times 10^{-6}/°C.$ from room temperature to 500° C., which is twice as high as the $2.5 \sim 3.5 \times 10^{-6}/°C.$ coefficient in the same temperature range for the silicon usually used as integrated circuit chips. Thus, alumina has a disadvantage in that the size of the integrated circuits must remain small in order to avoid thermal stress due to the termperature difference during the bonding operation.

Recently, mullite $(3AL_2O_3.2SiO_2)$, which has a thermal expansion coefficient relatively near that of silicon, has been proposed as a ceramic circuit substrate material, as disclosed in Japanese Patent Laid Open No. 49-116599 specification. However, the thermal expansion coefficient of mullite is $4.3 \times 10^{-6}/°C.$ from room temperature to 500° C., which value is also higher than that of silicon. No other processes are known to produce the desired ceramic materials.

SUMMARY OF THE INVENTION

A primary object of the present invention is to provide a ceramic substrate having a low thermal expansion coefficient.

Another object of the present invention is to provide a ceramic substrate having a low dielectric constant.

Still another object of the present invention is to provide a ceramic substrate having a high bulk density and no water absorption.

A further object of the present invention is to provide a ceramic substrate which can be produced by firing at a low temperature.

Other objects and advantages of the present invention will be apparent from the following description.

There is provided, according to the present invention, a ceramic substrate, consisting essentially of, based on the weight of the substrate, 0.5~5.0% by weight of MgO and 95.0~99.5% by weight of the total of $Al_2O_3$ and $SiO_2$, the proportion of the $Al_2O_3$ to the $SiO_2$ being in the range of from 50:50 to 80:20 by weight.

The ceramic substrate according to the present invention exhibits a structure within the grain boundaries between the mullite crystals $(3Al_2O_3.2SiO_2)$ are filled with cordierite $(2MgO.2Al_2O_3.5SiO_2)$. The ceramic substrate according to the present invention can be produced by using commercially available magnesia (MgO), alumina $(Al_2O_3)$ and Silica $(SiO_2)$.

The thermal expansion coefficient of cordierite from room temperature to 500° C. is $1 \sim 2 \times 10^{-6}/°C.$, which is lower than the $4.3 \times 10^{-6}/°C.$ of mullite, and the ceramic material of the present invention has a reduced thermal expansion coefficient, from room termperature to 500° C. of $3.8 \sim 3.9 \times 10^{-6}/°C.$, which is very close to the $2.5 \sim 3.5 \times 10^{-6}/°C.$ coefficient of integrated circuit silicon chips.

DESCRIPTION OF THE PREFERRED EMBODIMENTS

The present invention will be described in detail referring to the accompanying drawings and, also, the present invention will be compared with the prior art.

Figure 1:
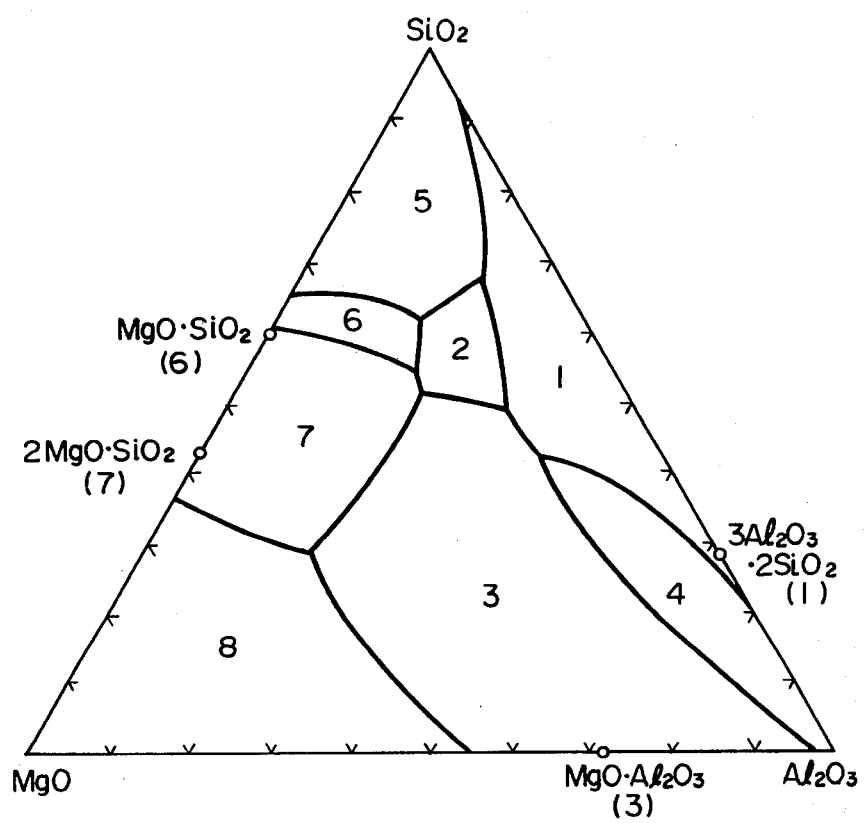
FIG. 1 is a phase diagram of the $Al_2O_3$—$SiO_2$—MgO system.

The phase diagram of the $Al_2O_3$—$SiO_2$—MgO system (FIG. 1) illustrates crystalline phases formed by mixing and firing alumina $(Al_2O_3)$, silica $(SiO_2)$ and magnesia (MgO). The marks on each side of the diagram represent the weight ratio of two of the three components.

The present inventors found that mainly mullite (3Al- $_2O_3.2SiO_2$) 1 is formed, as described hereinafter, by mixing 50~80% by weight of alumina and 20~50% by weight of silica, and firing them. Further, the inventors found that the grain boundaries between mullite crystals ($3Al_2O_3.2SiO_2$) can be filled with cordierite ($2MgO.2Al_2O_3.5SiO_2$) 2 by mixing 0.5~5.0% by weight of MgO and 95.0~99.5% by weight of the total of $Al_2O_3$ and $SiO_2$, the proportion of the $Al_2O_3$ to the $SiO_2$ being in the range of from 50:50 to 80:20 by weight, and firing the mixture. This weight proportion of $Al_2O_3$ to $SiO_2$ according to the present invention is suitable for forming mainly mullite crystals. If the weight proportion of $Al_2O_3$ to $SiO_2$ is outside the above mentioned weight proportion, the thermal expansion coefficient of the fired ceramics increases so much that it is not suitable for use as a circuit substrate. This is probably due to the fact that alumina or silica remains in an unreacted state without forming mullite crystals.

The weight proportion of $Al_2O_3$ to $SiO_2$ which is suitable for the formation of cordierite corresponds to the above-mentioned weight proportion of $Al_2O_3$ to $SiO_2$ suitable for forming mainly mullite. If the content of MgO is less than the lower limit of the above-mentioned range, almost no cordierite is formed, and the thermal expansion coefficient and the bulk density remain almost the same as in the case where no MgO is included. On the other hand, if the content of MgO is more than the upper limit of the above-mentioned range, spinel crystals ($MgO.Al_2O_3$) 3 are formed, which increase the thermal expansion coefficient of the ceramic material so much that it is not suitable for use as a circuit substrate.

Figure 2:
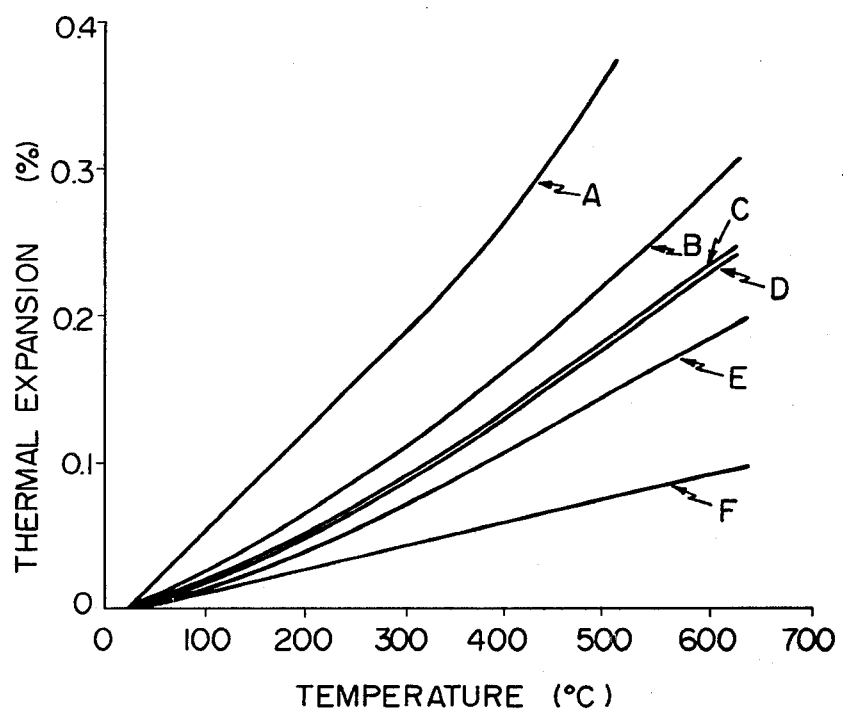
FIG. 2 is a graph showing the relationship between the thermal expansion and the temperature of the ceramic substrate materials of the present invention, as well as other materials.

FIG. 2 is a graph showing the relationship between the thermal expansion and the temperature of materials for use as circuit substrates or chips of integrated circuits. In FIG. 2, line A corresponds to alumina ($Al_2O_3$), and line B corresponds to mullite ($3Al_2O_3.2SiO_2$). Line C corresponds to a ceramic material of the present invention, which includes 0.5 or 5.0% by weight of MgO and 95.0 or 99.5% by weight of $Al_2O_3$ and $SiO_2$, the weight proportion of the $Al_2O_3$ to $SiO_2$ being 71.8:28.2, and line D also corresponds to a ceramic material of the present invention, which includes 1.0% by weight of MgO, and 99.0% by weight of $Al_2O_3$ and $SiO_2$, the weight proportion of the $Al_2O_3$ to the $SiO_2$ being the same as with line C. Finally, line E corresponds to silicon, which is used as integrated circuit chips to be bonded on the circuit substrate, and line F corresponds to cordierite ($2MgO.2Al_2O_3.5SiO_2$).

Referring to FIG. 2, alumina A, which has conventionally been used in the prior art as circuit substrate material, exhibits a higher thermal expansion than silicon E and, consequently, a higher thermal stress. Contrary to this, the thermal expansion of the ceramic materials of the present invention C and D is lower than that of alumina A and mullite B and close to silicon E of the integrated circuit material, because the grain boundaries between mullite crystals B are filled with cordierite F, which has the lowest thermal expansion.

Figure 3:
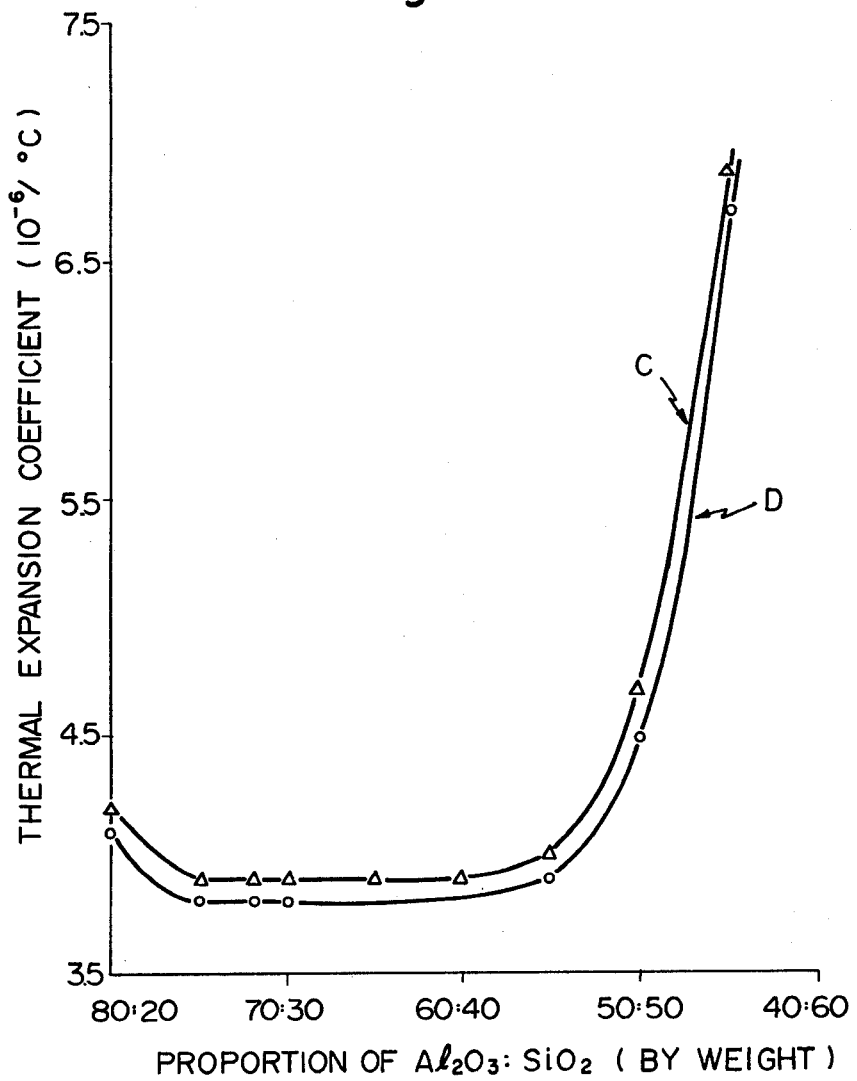
FIG. 3 is a graph showing the relationship between the thermal expansion coefficient and the weight proportion of $Al_2O_3$ to $SiO_2$ of ceramic materials of MgO-$Al_2O_3$—$SiO_2$ having different contents of MgO.

FIG. 3 is a graph showing the relationship between the thermal expansion coefficient and the weight proportion of $Al_2O_3$ to $SiO_2$ of ceramic materials of $MgO-Al_2O_3-SiO_2$ having different contents of MgO. In FIG. 3, line C corresponds to 0.5 or 5.0% by weight of MgO, and line D corresponds to 1.0% by weight of MgO. The weight proportions of $Al_2O_3$ to $SiO_2$ of both lines C and D are in the range of from 80:20 to 47:53. As can be seen from these curves, where the weight proportion of $Al_2O_3$ to $SiO_2$ is in the range of from 50:50 to 80:20 the thermal expansion coefficient is low. This is because the thermal expansion coefficient increases outside this range of $Al_2O_3$ to $SiO_2$, when a considerable amount of alumina and silica are included in the unreacted state.

Figure 4:
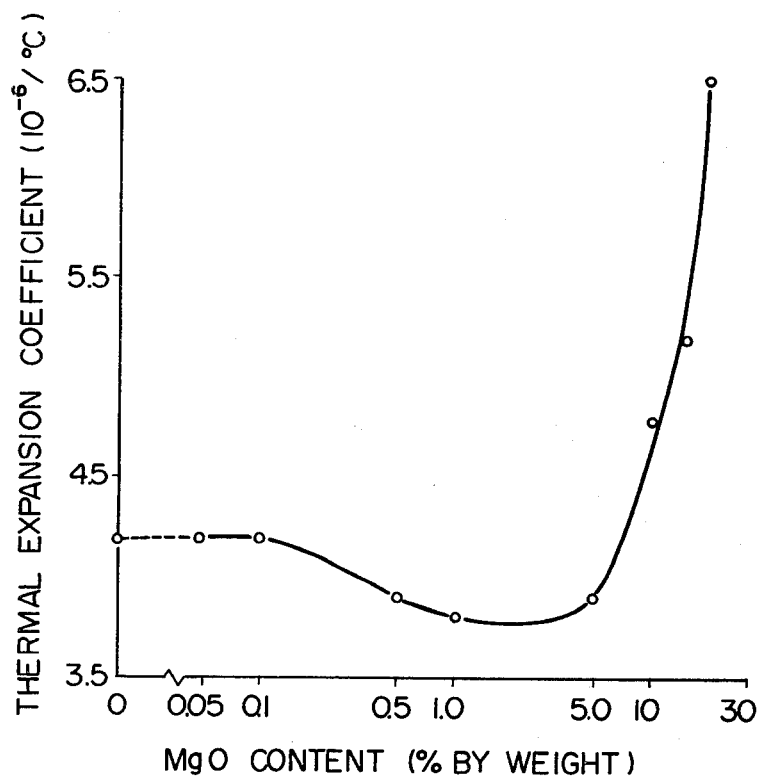
FIG. 4 is a graph showing the relationship between the thermal expansion coefficient and the content of Mgo of ceramic materials of MgO—$Al_2O_3$—$SiO_2$.

FIG. 4 is a graph showing the relationship between the thermal expansion coefficient and the content of MgO of ceramic materials of $MgO-Al_2O_3-SiO_2$. As shown in FIG. 4, the thermal expansion coefficient of the ceramic material from room temperature to 500° C. is reduced when the ceramic contains 0.5~5.0% by weight of MgO and 95.0~99.5% by weight of the total of $Al_2O_3$ and $SiO_2$, and the weight proportion of the $Al_2O_3$ to the $SiO_2$ is 71.8:28.2. If the content of MgO is less than 0.5% by weight, cordierite is formed only in a small amount, and the thermal expansion coefficient remains similar to mullite itself. If the content of MgO is more than 5.0% by weight, spinel ($MgO.Al_2O_3$) 3 is formed. Furthermore, if the content of MgO is over 10.0% by weight, the thermal expansion coefficient increases to $4.8 \times 10^{-6}$/°C., which is larger than that of mullite itself.

The ceramic substrate according to the present invention exhibits a thermal expansion coefficient from room temperature to 500° C. of $3.8~3.9 \times 10^{-6}$/°C., which is very close to the $2.5~3.5 \times 10^{-6}$/°C. of the silicon integrated circuit material.

Figure 5:
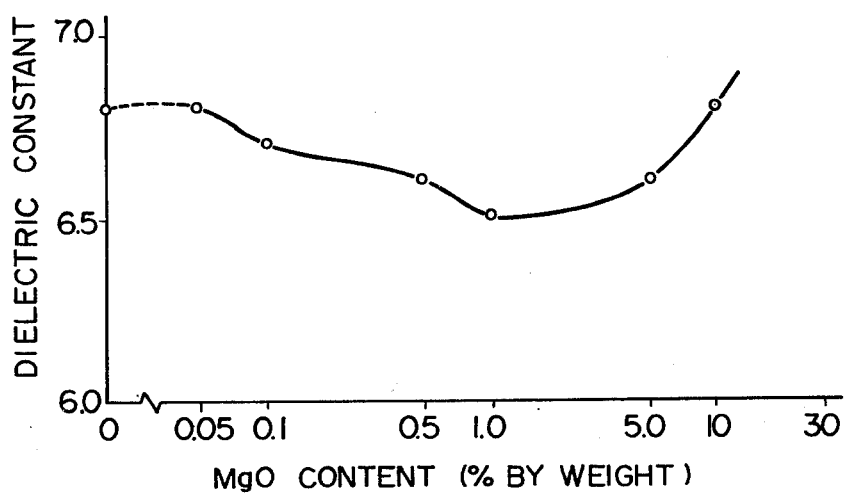
FIG. 5 is a graph showing the relationship between the dielectric constant and the content of MgO of ceramic materials of MgO—$Al_2O_3$—$SiO_2$.

FIG. 5 is a graph showing the relationship between the dielectric constant (1 MHz, 20° C.) and the content of MgO of ceramic materials of $MgO-Al_2O_3-SiO_2$. As can be seen from FIG. 5, the dielectric constant is 6.5~6.6 when the content of MgO is in the range of 0.5~5.0% by weight and the rest consists essentially of $Al_2O_3$ and $SiO_2$, the weight proportion of which is 71.8:28.2. If the content of MgO is either more or less than the above mentioned range, the dielectric constant of the ceramic material increases. Thus, the ceramic material having the content of MgO according to the present invention has the advantage of lowering the dielectric constant from that of mullite, which improves the transmission line characteristics of circuits formed on the ceramic substrate.

Figure 6:
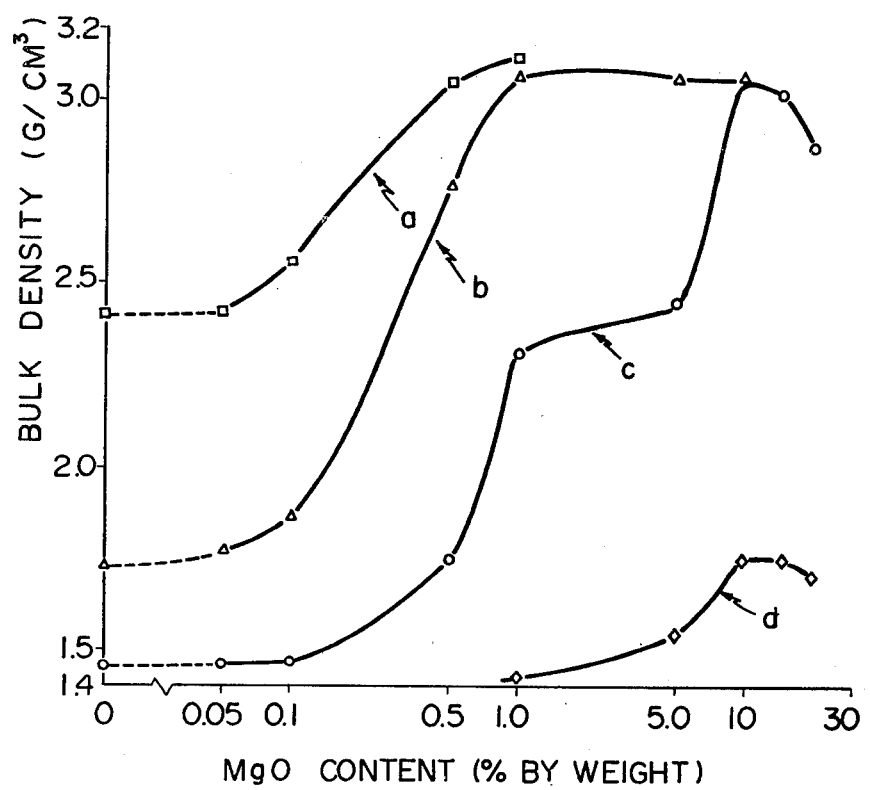
FIG. 6 is a graph showing the relationship between the bulk density and the content of MgO of ceramic materials of MgO—$Al_2O_3$—$SiO_2$ fired at different temperatures.

FIG. 6 is a graph showing the relationship between the bulk density and the content of MgO of ceramic materials of $MgO-Al_2O_3-SiO_2$ fired at different temperatures. The content of MgO is expressed in % by weight and the rest consists esssentially of $Al_2O_3$ and $SiO_2$, the weight proportion of which is 71.8:28.2. Curves a, b, c and d correspond to firing temperatures of 1550°, 1500°, 1450° and 1400° C., respectively. The conditions under which the ceramic substrate was prepared and fired will be described in the Examples below. As can be seen from the curves, the bulk density is increased when the ceramic materials include 0.5~10.0% by weight of MgO at a firing temperature higher than 1500° C.

Figure 7:
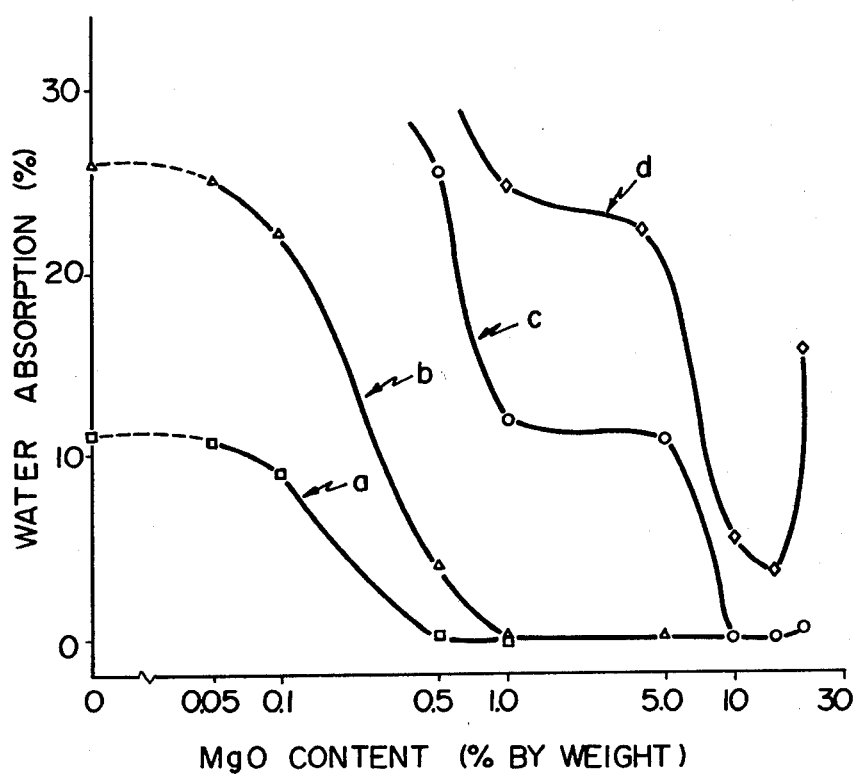
FIG. 7 is a graph showing the relationship between the water absorption and the content of MgO of ceramic materials of MgO—$Al_2O_3$—$SiO_2$ fired at different temperatures.

FIG. 7 is a graph showing the relationship between the water absorption and the content of MgO of ceramic materials of $MgO-Al_2O_3-SiO_2$ fired at different temperatures. The content of MgO is expressed in % by weight and the rest consists essentially of $Al_2O_3$ and $SiO_2$, the weight proportion of which is 71.8:28.2. Curves a, b, c and d correspond to firing temperatures of 1550°, 1500°, 1450° and 1400° C., respectively. As can be seen from the curves, the water absorption of the ceramic is considerably reduced when MgO is included in the range of 0.5~20.0% by weight at a firing temperature higher than 1500° C. Further, the firing temperature of ceramic material of MgO—Al$_2$O$_3$—SiO$_2$ having a high bulk density with no water absorption is relatively low, compared with the case where mullite is obtained by firing at 1650° C. Consequently, the resulting ceramic material can be used as a circuit substrate.

Generally, the bulk density of a ceramic substrate corresponds inversely to the porosity and its water absorption corresponds to the porosity. Therefore, the ceramic substrate according to the present invention exhibits a low porosity.

Figure 8A:
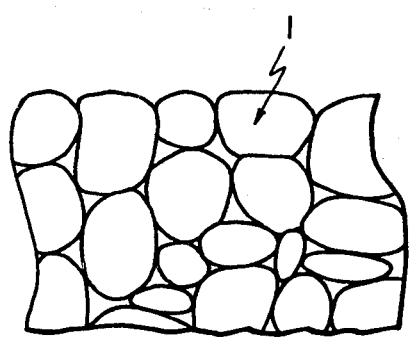
FIG. 8A is a structural model of a mullite substrate composition.
Figure 8B:
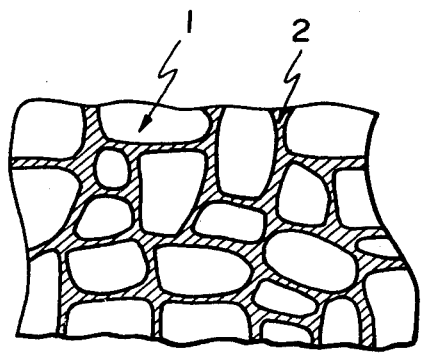
FIG. 8B is a structural model of a mullite substrate composition having grain boundaries which are filled with cordierite according to the present invention.

FIG. 8A is a structural model of a mullite substrate composition and FIG. 8B is a structural model of the ceramic substrate composition of the present invention. The grain boundaries between the mullite crystals 1 are filled with cordierite 2, as shown in FIG. 8B. Cordierite is formed in a liquid phase during the firing and is thereafter solidified. Although the ceramics of MgO—Al$_2$O$_3$—SiO$_2$ having a content of MgO even higher than 5.0% by weight, which have been fired at a temperature of 1500°~1550° C., exhibit a sufficiently low porosity to be used as a substrate, the thermal expansion coefficient increases, due to the formation of spinel crystals, to such an extent that it is not suitable for use as a circuit substrate.

In summary, the ceramic substrate according to the present invention, which includes appropriate amount of MgO, Al$_2$O$_3$ and SiO$_2$ so as to form cordierite which fills in the grain boundaries between the mullite crystals, exhibits the following advantages.

First, the thermal expansion coefficient of the ceramic substrate is very near that of the integrated circuit silicon chips bonded on the substrate. Consequently, the thermal stress caused by the difference in the thermal expansion is small and, therefore, the size of chips which can be bonded safely can be large.

Second, the high bulk density with no water absorption of the ceramic substrate makes it possible to reduce imperfections of the patterns formed directly thereon which interconnect the integrated circuits, and the low dielectric constant of the ceramic substrate can improve the transmission line characteristics of the interconnected circuits formed thereon over those formed on the prior alumina or mullite substrate.

Third, the ceramic substrate according to the present invention can be produced by using commercially available raw materials and firing them at a relatively low temperature.

EXAMPLE 1

Alumina (Union Carbide Co.), silica (Wako Junyaku Co.) and magnesia (Wako Junyaku Co.) were used as raw materials for producing a ceramic substrate. 71.8% by weight of alumina powder and 28.2% by weight of silica powder were mixed in a polyethylene pot using alumina balls for four hours. The mixed powder was fired in air, at 1300° C., for one hour, so as to form mullite crystals. The crystals were ground using alumina balls in a polyethylene pot for 24 hours. One part by weight of magnesia powder was added to 99 parts by weight of the ground crystal powder. Then, 10 parts by weight of butyral as a binder, 14 parts by weight of di-butyl phthalate as a plasticizer, 1.4 parts by weight of OP-85R (Nippon Yushi Co.) as a deflocculant, as well as 38 parts by weight of methyl ethyl ketone, 27 parts by weight of methyl alcohol and 8.5 parts by weight of butyl alcohol as solvents, were added to 100 parts by weight of the powder in a polyethylene pot and milled using alumina balls for 140 hours to form a slurry.

A green sheet was formed from the slurry using the Doctor blade casting method, prefired in air, at 1300° C., for one hour, and fired in air, at 1550° C., for two hours. Cordierite was formed in the grain boundaries between the mullite crystals.

The fired ceramic substrate exhibited a thermal expansion coefficient of $3.8 \times 10^{-6}$/°C. from room temperature to 500° C., a dielectric constant of 6.5 (1 MHZ, 20° C.), a bulk density of 3.13 g/cm$^3$ and a water absorption of 0.00%, as shown in FIGS. 4, 5, 6 and 7, separately.

Au-paste 9791 (E. I. du Pont de Nemours & Co.) was printed by a screen process on an undercoat of Au-Pt paste 8895 (E. I. du Pont de Nemours & Co.) on the surface of the fired ceramic substrate (100×100 mm), and the substrate having the pastes thereon was fired in air, at 950° C., for 10 minutes so as to form metallized layers on the substrate.

An NiCr-Au film was formed by a vaccuum evaporation process on the bottom surface of a silicon wafer with a 76 mm diameter, which is usually used for the production of integrated circuits. This silicon wafer was put on the metallized layer while Au-Sn alloy having a melting point of 280° C. was inserted therebetween and the substrate was heated up to 300° C. The silicon wafer was successfully bonded to the ceramic substrate according to the present invention.

EXAMPLE 2

Ceramic substrates were prepared in a manner similar to that mentioned in Example 1, except that the weight proportion of Al$_2$O$_3$ to SiO$_2$ was varied in the range of from 47:53 to 80:20, and the contents of Mgo were 0.5, 1.0 and 5.0% by weight. The relationship between the thermal expansion coefficient and the weight proportion of Al$_2$O$_3$ to SiO$_2$ is shown by curves in FIG. 3.

EXAMPLE 3

Ceramic substrates were prepared in a manner similar to that mentioned in Example 1, except that the content of Mgo was varied in the range of from 0.05 to 20% by weight. The relationship between the thermal expansion coefficient and the content of MgO is shown in FIG. 4 and the relationship between the dielectric constant and the content of MgO is shown in FIG. 5.

EXAMPLE 4

Ceramic substrates were prepared in a manner similar to that mentioned in Example 3, except that the firing was carried out at 1400°, 1450°, 1500° and 1550° C. The relationship between the bulk density, the content of MgO and the firing temperature is shown in FIG. 6 and the relationship between the water absorption, the content of MgO and the firing temperature is shown in FIG. 7.

What is claimed is:

1. An electronic device comprising as main components an integrated circuit silicon chip bonded on a ceramic substrate, which consists essentially of, based on the weight of the substrate, 0.5~5.0% by weight of MgO and 95.0~99.5% by weight of the total of Al$_2$O$_3$ and SiO$_2$, the proportion of the Al$_2$O$_3$ to the SiO$_2$ being in the range from 50:50 to 80:20 by weight said ceramic substrate exhibiting a structure in which the grain boundaries between the mullite crystals (3Al$_2$O$_3$.2SiO$_2$) are filled with cordierite (2MgO.2Al$_2$O$_3$.5SiO$_2$), said substrate having a thermal expansion coefficient of $3.8~3.9 \times 10^{-6}$/°C. from room temperature to 500° C., which coefficient is close to that of the silicon chip, viz. $2.5~3.5 \times 10^{-6}$/°C. from room temperature to 500° C.

* * * * *

UNITED STATES PATENT AND TRADEMARK OFFICE
CERTIFICATE OF CORRECTION

PATENT NO.  : 4,460,916

DATED       : Jul. 17, 1984

INVENTOR(S) : Hashimoto et al.

It is certified that error appears in the above-identified patent and that said Letters Patent is hereby corrected as shown below:

```
Column 1, line 36, after "and" insert --may--.
Column 2, line 12, "within" should be --wherein--;
          line 40, "Mgo" should be --MgO--.
Column 3, line 10, "Sio2" should be --SiO2--.
Column 5, line 25, after "includes" insert --an--.
Column 6, line 6,  "MHZ" should be --MHz--;
          line 17, "vaccuum" should be --vacuum--;
          line 30, "Mgo" should be --MgO--;
          line 38, "Mgo" should be --MgO--;
          line 60, after "weight" insert --,--.
```

Signed and Sealed this

Fifteenth Day of January 1985

[SEAL]

Attest:

Attesting Officer

GERALD J. MOSSINGHOFF

Commissioner of Patents and Trademarks